United States Patent [19]
Lackey, Jr. et al.

[11] Patent Number: 5,527,747
[45] Date of Patent: Jun. 18, 1996

[54] RAPID PROCESS FOR THE PREPARATION OF DIAMOND ARTICLES

[75] Inventors: Walter J. Lackey, Jr., Marietta; John A. Hanigofsky, Smyrna, both of Ga.

[73] Assignee: Georgia Tech Research Corporation, Atlanta, Ga.

[21] Appl. No.: 501,433

[22] Filed: Jul. 12, 1995

Related U.S. Application Data

[63] Continuation of Ser. No. 247,511, May 23, 1994, abandoned, which is a continuation of Ser. No. 771,735, Oct. 4, 1991, abandoned.

[51] Int. Cl.$^6$ ............................................. C04B 35/52
[52] U.S. Cl. ........................... 501/90; 501/87; 501/95; 423/446; 427/249
[58] Field of Search ...................... 427/249; 423/446; 501/87, 90, 95

[56] References Cited

U.S. PATENT DOCUMENTS

| | | | |
|---|---|---|---|
| 4,220,455 | 9/1980 | St. Pierre et al. | 501/90 |
| 4,580,524 | 4/1986 | Lackey et al. | 118/725 |
| 4,882,138 | 11/1989 | Pinneo | 423/446 |
| 5,071,677 | 12/1991 | Patterson et al. | 423/446 |
| 5,106,452 | 4/1992 | Kadono et al. | 423/446 |
| 5,110,405 | 5/1992 | Sawabe et al. | 423/446 |
| 5,270,028 | 12/1993 | Tanabe et al. | 423/446 |

OTHER PUBLICATIONS

Int'l Encyc. of Composites, Ceramic Matrix Composites CVI: Chemical Vapor Infiltration (VCH, N.Y., Stuart M. Lee, Editor).

Lackey, W.J., et al., "Sphere–Pac–A Practical Remote Fuel Fabrication Concept", 23 Transactrons of the A.N.S. 276 (1979).

Lackey, W.J., et al., "Assessment of Gel–Sphere–Pac Fuel for Fast Breeder Reactors", ORNL–5468 (Oct. 1978).

*Primary Examiner*—Michael Lewis
*Assistant Examiner*—Stuart L. Hendrickson
*Attorney, Agent, or Firm*—Deveau, Colton & Marquis

[57] ABSTRACT

A rapid process for the preparation of diamond articles in which a porous, dense preform of diamond particles created by particle packing methods is subjected to forced flow chemical vapor infiltration of a carbon containing reagent gas resulting in the preparation of thick diamond articles.

22 Claims, 5 Drawing Sheets

RAPID PROCESS FOR THE PREPARATION OF DIAMOND ARTICLES

This is a continuation of application Ser. No. 08/247,511 filed on May 23, 1994, abandoned, which is a continuation of application Ser. No. 07/771,735 filed on Oct. 4, 1991, now abandoned.

BACKGROUND OF THE INVENTION

1. Field of the Invention

This invention relates generally to the use of chemical vapor infiltration (CVI) to bond diamond particles together resulting in a composite article comprising diamond particles in a diamond deposit matrix. This invention relates more specifically to the use of a forced flow chemical vapor infiltration approach in which carbon vapor reactant gases are forced to flow through a preform of densely packed, using particle packing theory, diamond particles and/or fibers resulting in a densification of the preform so as to form a strong composite diamond article.

2. Prior Art

The plasma assisted chemical vapor deposition (CVD) of diamond films for coatings using low pressure, moderate temperature processing conditions has been studied actively for the past ten years. However, current deposition techniques are often not practical for the fabrication of thick (few millimeters) articles because the deposition rate is low (typically 1 µm per hour). Various approaches are under development for increasing the deposition rate but none have been entirely satisfactory to date. Often attempts to increase the rate of deposition have resulted in inferior quality deposits. For example, running the reactor with a high reagent gas flow rate and/or concentration tends to result in the deposition of carbon films instead of diamond.

Although these solutions have had some success in the deposition of chemical vapors for coating purposes, they have not been successful in achieving fast deposition and creation of large size samples or articles. The lack of any satisfactory process for creating large size samples or articles of diamond material within a reasonable length of time, that is, having a deposition rate fast enough to be practical, and the inability to tailor the final properties of the material currently are the bane of the CVD diamond art.

The rapid process for the preparation of diamond articles disclosed herein overcomes the above problems by being able to rapidly fabricate large size diamond components using a unique CVD process which involves chemical vapor infiltration (CVI) of diamond particles using a carbon vapor.

In the CVI process, a matrix is chemically vapor deposited within a porous preform to produce a composite material. CVD in general results in the production of a coating, while CVI in specific results in the production of a composite article. Thus, CVI is considered a specialized form of CVD. The preform may consist of particulates, fibers, or any other suitable constituents or materials which will form a porous medium. The preform to be subjected to CVI is placed in a modified CVD reactor. Gaseous CVD reagents penetrate the pores of the preform and deposit onto the surfaces of the particles. As the deposition process continues, the particles are coated and grow, and consequently the spaces between the particles become smaller. Eventually, the particle coatings interlock and the particles are bonded together by the coating. This coating is the matrix which along with the original particles constitutes the composite.

CVI processes can be classified into five types as illustrated in FIG. 1. The bases for the classification are (1) whether the preform is uniformly heated, that is isothermal, or contains a thermal gradient and (2) the manner in which the gaseous reagents contact or flow through the preform. CVI Type I (FIG. 1a) is an isothermal process in which the reagent gases surround a preform maintained at a uniform temperature and enter the preform via diffusion. CVI Type II (FIG. 1b) is a thermal gradient process in which the reagent gases flow across and contact the cold side of a preform having a thermal gradient across it and enter the preform via diffusion. CVI Type III (FIG. 1c) is an isothermal forced-flow process in which the reagent gases flow through the preform via a forced flow. CVI Type IV (FIG. 1d) is a thermal gradient process in which the reagent gases are forced to flow through a preform having a thermal gradient across it from the cooler surface to the warmer surface. CVI Type V (FIG. 1e) is an isothermal pulsed flow process in which the reagent gases flow into and out of the preform via a pulse flow, creating a cyclical evacuation and back filling of the preform. A sixth type of CVI process, CVI Type VI, not shown in FIG. 1, is a pulsed flow process similar to that of CVI Type V, but in which a thermal gradient is created across the preform.

In the Type I isothermal process, the preform is maintained at a uniform temperature, and the reagent gases flow through the furnace. There is no provision for forcing the reagent gases to flow through the preform, and therefore the reagent gases enter the preform only by chemical diffusion. Since chemical diffusion is slow, the Type I isothermal infiltration method typically requires very long infiltration times, generally on the order of weeks, and there is often a density gradient from the surface toward the center of the preform. The Type II processes, while achieving somewhat higher diffusion rates, also requires very long infiltration times, and is thus impracticable.

For the forced-flow (Type III and Type IV) CVI processes, the reagent gas stream is constrained to flow through the preform. The Type IV thermal gradient-forced flow infiltration method has the advantage of significantly reduced infiltration times and, by proper adjustment of process variables, achieves a relatively unitary density throughout the component. Compared to the Type III isothermal forced-flow technique, processing time for the Type IV thermal gradient-forced flow infiltration method typically is reduced by a factor of about 50.

The greatest use of CVI processing has been to fabricate carbon matrix-carbon fiber and silicon carbide matrix-carbon or silicon carbide fiber composites for aircraft brakes, rocket nozzles, nose cones and other aerospace components. Fiber preforms with initial densities of 40–50% have been densified in large scale commercial processing to 85% of theoretical density. See the International Encyclopedia of Composites, Ceramic Matrix Composites CVI: Chemical Vapor Infiltration (VCH, New York; Stuart M. Lee, Editor; W. J. Lackey, contributing author), which article is incorporated herein by this reference, and the references cited therein, and made a part hereof. Particulate preforms consisting of nuclear fuel particles also have been consolidated successfully using C.I processing. Consolidated densities of 85–90% are possible since a ceramic body remains permeable until a density of approximately 90% theoretical is reached.

A process and apparatus for the preparation of fiber reinforced composites by chemical vapor deposition has been patented by one of the present inventors under U.S. Pat. No. 4,580,524. The '524 patent discloses a process and apparatus for creating a thermal gradient across a fibrous preform, thus creating a thermal gradient process as described above, and directing a flow of gaseous material into the preform, thus completing the forced flow thermal gradient process similar to the CVI Type IV process described above. In turn, the gaseous material is deposited into the preform so as to produce a fiber reinforced ceramic material. The apparatus comprises a means for supporting the preform, means for heating and cooling different surfaces of the preform, and a means subjecting the preform to a forced flow. An apparatus somewhat similar to this type is suitable for the rapid process for producing diamond articles disclosed herein. However, this apparatus has never been utilized to carry out a rapid process for the preparation of diamond articles as it was not thought theoretically possible to be able to vaporize a carbon source and deposit diamond by a chemical vapor infiltration process applied to packed diamond particles due to the unique activation process required.

Diamond deposition occurs via a plasma assisted process. The presence of atomic hydrogen, H·, is accepted as necessary to grow diamond films. To produce atomic hydrogen, some plasma activation is necessary. Known methods for achieving plasma activation include microwaves, RF power, tungsten filaments, acetylene torches, and DC arcs. The '524 patent is a conventional CVD/CVI furnace, and has, at best, only a limited capability to activate a plasma process.

A method for preparation of diamond ceramics is disclosed in U.S. Pat. No. 4,882,138 to J. M. Pinneo. The '138 patent discloses a typical method for consolidating diamond particles in which a compacted aggregation of diamond particles is contacted with a gaseous carbon source and atomic hydrogen in a plasma enhanced reactor. The diamond particles are previously compacted through mechanical pressure, vibratory or other means, and are subjected to plasma enhanced chemical vapor deposition at pressure from about $10^{-2}$ torr to $10^3$ torr at temperatures ranging from about 800° C. to about 1450° C. The '138 patent discloses a process which relies on the typical chemical vapor deposition process and does not disclose the use of a forced flow CVI process. Therefore, the '138 patent has the disadvantage of not being a rapid process, due to its lack of a forced flow, and is more similar to Type I and Type II CVI processes discussed above.

Developing a forced flow CVI process for the deposition of diamond is not obvious in light of the '138 patent. The method, parameters, and the appropriate fixturing disclosed herein which allows the forced flow CVI in a diamond particulate preform are not obvious as evidenced by the near universal belief of those skilled in the art that diamond deposition is a surface process. Current art has not fully extended to the forced flow deposition of diamond within a preform to obtain composites.

The prior art technology has several disadvantages when applied to the preparation of diamond articles. Although a thick film deposition can be achieved with the current technology, a 1 mm substrate would take over one month to be deposited at the typical deposition rate of about 1 micron per hour. Obviously, using the prior art techniques, the length of time to deposit enough diamond to fabricate a large article would be prohibitively long. Further, the chemical vapor infiltration of diamond has been demonstrated using only relatively slow chemical diffusion to densify the composite. Current chemical diffusion technology also is very time intensive, taking over one month to partially densify a 3 mm thick disc.

The prior art technology has failed to fully recognize both the use of a plasma in a forced flow CVI process and the ability of a plasma to infiltrate a preform using a forced flow CVI process to deposit diamond within the interior of the preform and not merely on the surface of the preform. It generally has been the experience that forced flow processes are detrimental to the existence of plasmas, as the forced flow theoretically upsets the plasma. Further, plasma enhanced chemical vapor deposition has heretofore been considered a surface deposition technology, resulting in the deposition of the selected material only on the surface of the substrate. Although the use of a plasma to deposit diamond within an aggregation of diamond particles has been described in the '138 patent, the use of a forced flow in connection with a plasma to achieve CVI in a densely packed (using particle packing theory) diamond preform has not been disclosed or theorized in the prior art.

Typically, the substrates subjected to CVD have been solid wafers or particles contained in crucibles. Both of these forms have disadvantages when used in a forced flow CVI process. It is difficult if not impossible to force flow reagent gases into or through a solid wafer. Therefore, a surface coating typically results on a solid wafer subjected to CVI. A forced flow obviously will disrupt a powder substrate. Consequently, forced flow generally is not used in the CVI of powder substrates. The CVI reactor developed for the present invention also includes a novel support apparatus for effectively containing a fragile powder substrate in a forced flow process.

BRIEF SUMMARY OF THE INVENTION

Accordingly, it is an object of the present invention to provide a rapid process for the preparation of diamond articles which utilizes a forced flow chemical vapor infiltration method.

It is another object of the present invention to provide a rapid process for the preparation of diamond articles in which carbon reagent gases are forced to flow through a preform of diamond particles, fibers, fibers plus particulates or other constituents.

Yet another object of the present invention is to provide a rapid process for the preparation of diamond articles in which large diamond articles are formed.

Still another object of the present invention is to provide a rapid process for the preparation of diamond articles which overcomes the slow deposition times currently realized for diamond deposition.

Yet another object of the present invention is to provide a rapid process for the preparation of diamond articles in which densification times are increased by a factor of up to 50 or more over currently available densification processes.

It is yet another object of the present invention to provide a rapid process for the preparation of diamond articles which is more economical than current diamond article diamond preparation methods.

Another object of the present invention is to provide a rapid process for the preparation of diamond articles which have the potential for high thermal conductivity substrate materials.

An additional object of the present invention is to provide a rapid process for the preparation of diamond articles in various different sizes for various different uses such as for electromagnetic windows and domes, nozzles, dies, tools, substrates, aerospace applications, brakes, and irregularly shaped parts.

Yet another object of the present invention is to provide a rapid process for the preparation of diamond articles which has a fast deposition rate and results in the preparation of large sample sizes.

A further object of the present invention is to provide a rapid process for the preparation of diamond articles utilizing high density preforms made by taking advantage of particle packing theory, for example, vibratory compaction, slip casting or vacuum slurry molding.

Still another object of the present invention is to provide a rapid process for the preparation of diamond articles which uses elongated fibers or fibers interspersed with diamond particles to act as nucleation sites.

It is another object of the present invention to provide a rapid process for the preparation of diamond articles which utilizes a pulsed flow chemical vapor infiltration method.

One further object of the present invention is to provide a rapid process for the preparation of diamond articles which utilizes a permeable preform which can be subjected to chemical vapor infiltration under isothermal conditions or under thermal gradient conditions.

These and other objects are accomplished by the present rapid process for preparation of diamond articles which utilizes a forced flow chemical vapor infiltration approach with a preform of controlled density and permeability. A preform matrix comprising diamond particulates, very high conductivity carbon fiber or other suitable base materials which will form a permeable preform densely packed using particle packing techniques, is placed in a chemical vapor infiltration apparatus. The CVI apparatus can create either isothermal or thermal gradient conditions through the preform. Carbon reagent gases then are forced by appropriate fixturing to flow through the preform and to the exhaust. The carbon reagent gases penetrate the pores of the preform and deposit as solid diamond onto the surfaces of the particles. As the deposition process continues, the particles grow in size and consequently the spaces between the particles are reduced. Eventually, the particle coatings interlock and the particles are bonded together by the diamond coating. This coating and the particles constitutes the composite.

This method will be apparent to those skilled in the art when the following Detailed Description of a Preferred Embodiment is read in connection with the accompanying figures, in which like reference characters designate like components throughout the several views.

BRIEF DESCRIPTION OF THE FIGURES

FIG. 1 illustrates the five general CVI types.

DETAILED DESCRIPTION OF A PREFERRED EMBODIMENT

Figure 1A:
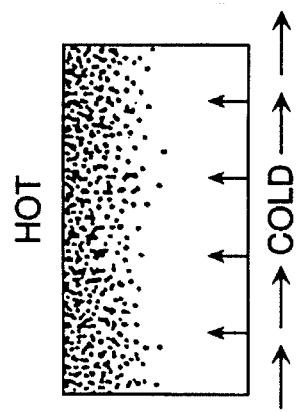
FIG. 1a represents CVI Type I.
Figure 1B:
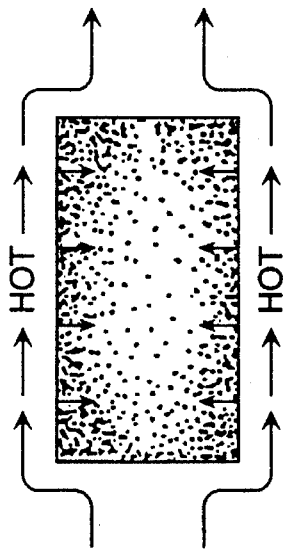
FIG. 1b represents CVI Type II.
Figure 1E:
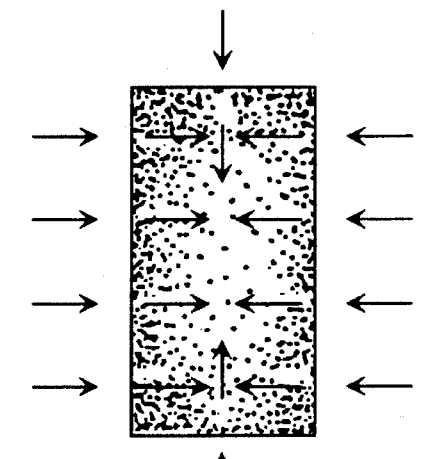
FIG. 1e represents CVI Type V.
Figure 1D:
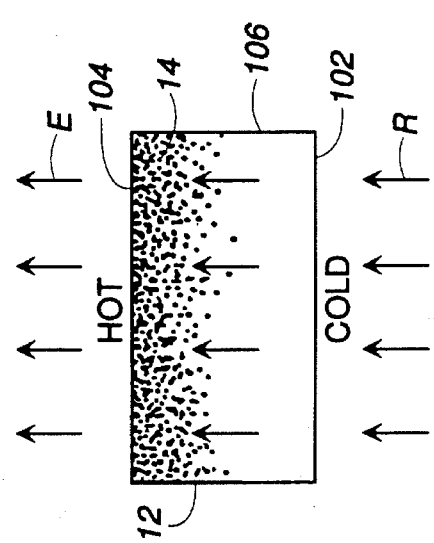
FIG. 1d represents CVI Type IV.
Figure 1C:
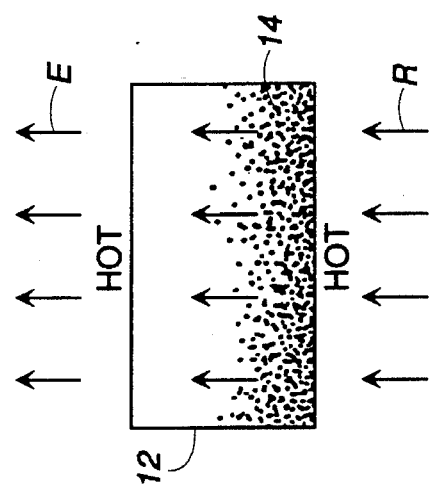
FIG. 1c represents CVI Type III.

The preferred embodiment of the present rapid process for the preparation of diamond articles takes advantage of the forced flow method of CVI, shown generally in FIG. 1c and FIG. 1d. A typical set up for a forced flow CVI apparatus is shown in schematic detail in FIG. 2, which basically is a CVD reactor configured and modified for CVI. The reactor configuration which is suitable for the present forced flow CVI process is described in this inventor's U.S. Pat. No. 4,580,524, incorporated herein by this reference, with a modified reactor as shown in FIG. 3 to allow plasma activation and the use of particulate preforms. The actual CVI process disclosed herein can be seen in enlarged detail in the schematical cross-section shown in FIG. 3. FIG. 3 represents the placement of the preform and the forced flow of the reagent gases through the preform, resulting in CVI in the preform and the deposition of diamond within the preform. As disclosed below, two important modifications to the reactor are a novel method and apparatus for supporting the preform during forced flow conditions, and the addition of an energy source, such as microwaves, to provide sufficient activation energy to allow plasma activation.

Two types of forced flow CVI can be used in the present process. The first forced flow CVI type, Type III shown in FIG. 1c, relies on the forced flow of carbon reagent gases R through a uniformly heated, essentially isothermal preform 12. Deposition of diamond on the preform 12, represented by the reference character 14, occurs throughout the preform 12. This process works well until sufficient diamond has been deposited on the preform particles 64 so that the preform 12 reaches sufficient density to become impermeable, at which time the flow of reagent gases R generally terminates, even though other regions of the preform 12 may be of a lower density and not impermeable. Typically, more deposition occurs near the preform 12 surface through which reagents gases R enter, because the reagents gases R concentration is highest at the entrance surface. Further, within the preform 12, the reagent gases R concentration is lower, especially further away from the entrance surface, as reagent R depletion is a natural consequence of flow.

The second forced flow CVI type which is suitable for the present process is the thermal gradient-forced flow process, Type IV shown in FIG. 1d. Thermal gradient-forced flow CVI takes advantage of both a thermal gradient across the preform 12 and a forced flow of reagent gases R through the preform 12 to enhance infiltration of reagent gases R. The reagent gases R enter the preform 12 through a cooler surface 102 of the preform 12 and are forced downstream through the preform 12 and out a hotter surface 104 of the preform 12. The temperature gradient increases through the preform 12 from the cooler surface 102 to the hotter surface 104. Deposition of diamond from the reagent gases R onto the preform particles 64, also represented by the reference character 14, occurs within regions of the preform 12 that are hot enough to promote the deposition reaction. Thus, the initial deposition occurs proximate to the hotter surface 104. As deposition continues, the volume of the preform 12 in which deposition occurs becomes denser, therefore increasing in thermal conductivity, therefore causing greater portions of the preform 12 to become hotter further away from the hotter surface 104 and toward the cooler surface 102. Therefore, as the preform 12 becomes densified it becomes hotter, and deposition occurs further away from the hot surface 104. To create a larger thermal gradient, so as to enhance the deposition within the preform 12, the cooler surface 102 can be actively cooled. The pulsed CVI processes also may be used in the present invention.

Various methods for attaining essentially uniform deposition rates throughout the preform 12 are discussed in the inventor's U.S. Pat. No. 4,580,524, which is incorporated herein by this reference. Cooling the side surfaces 106 of the preform 12 creates a lens-shaped thermal gradient throughout the preform 12, helping to attain a more uniform densification of the preform 12. A discussion of the various types of CVI and the reaction parameters necessary for successful general CVI processes can be found in the International Encyclopedia of Composites, Ceramics Matrix Composites CVI: Chemical Vapor Infiltration (VCH, New York; Stuart M. Lee, Editor; W. J. Lackey, contributing author), written by the present inventor and incorporated herein by this reference. Briefly, uniform infiltration can be achieved by selecting process conditions (temperatures, temperature gradient, reagent concentration, and flow rate) that balance the opposing tendencies for (a) greater deposition to occur in the hotter regions as a result of the influence of temperature on reaction kinetics and (b) greater deposition to occur in the cooler regions because of the higher reagent concentration.

Figure 2:
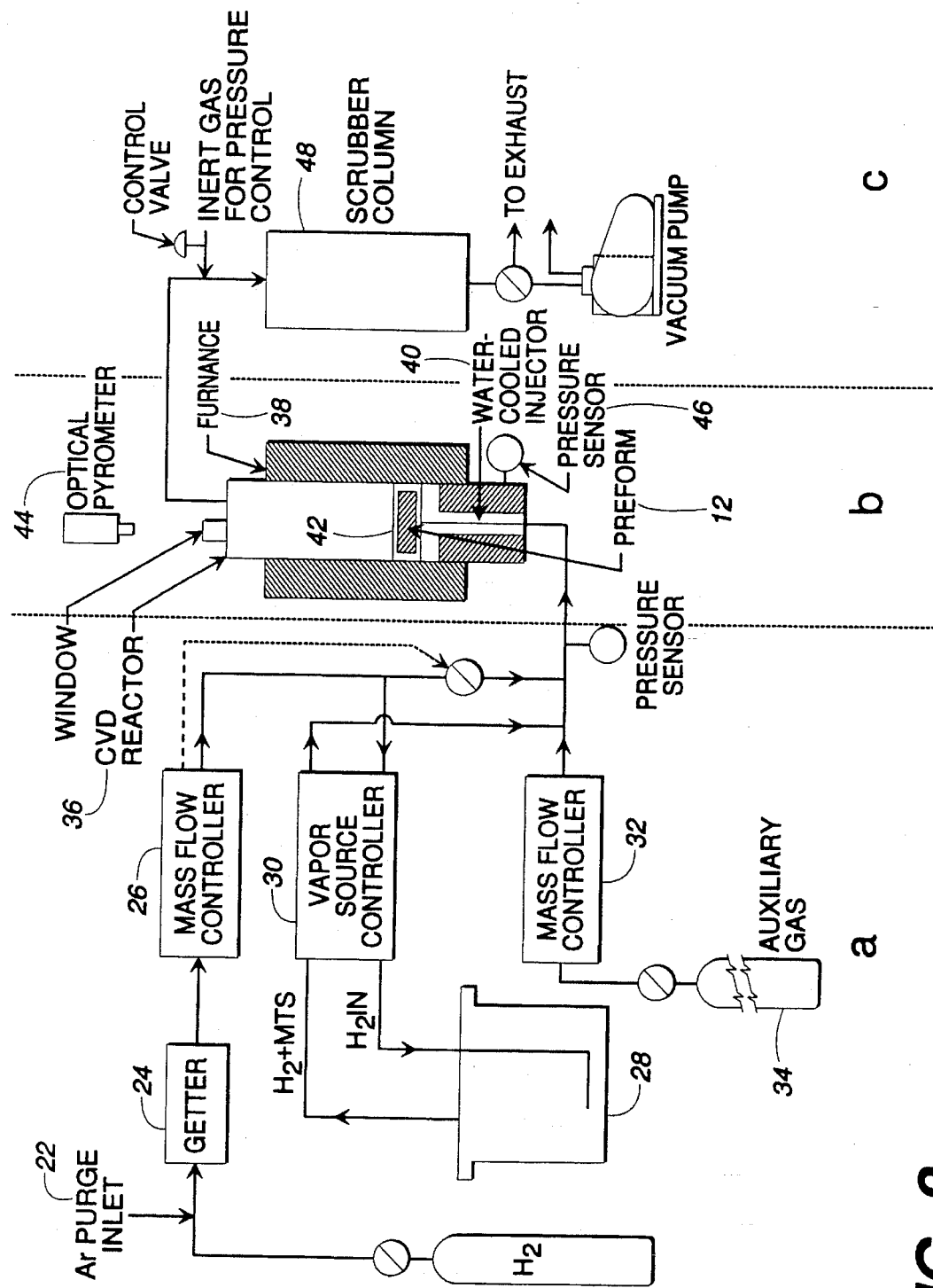
FIG. 2 is a schematic of a preferred apparatus for carrying out the CVI process of the present invention.
Figure 3:
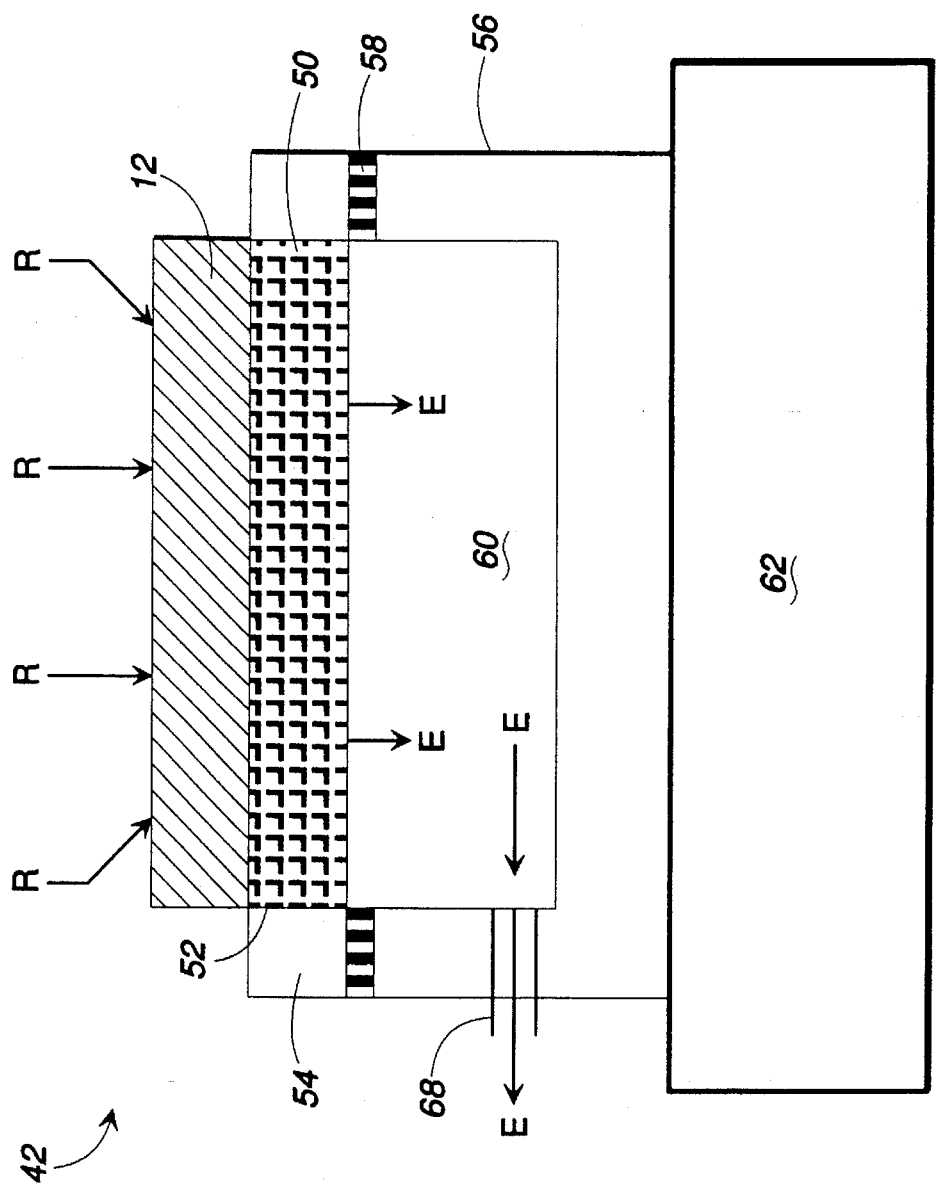
FIG. 3 is a schematical cross-section of the preform undergoing forced flow CVI consolidation according to the process of the present invention.

A preferred embodiment of the apparatus to carry out the present rapid process for the preparation of diamond articles is shown schematically in FIG. 2. Section a of FIG. 2 represents the reagent gas preparation section in which atomic hydrogen, H·, is combined with a carbon source, typically $CH_3·$, to form the reagent gases R. The actual CVI process takes place in the CVD reactor 36 shown in section b of FIG. 2. The exhaust or effluent gases E from the CVI reactions are handled in the effluent gas handling equipment shown in section c of FIG. 2.

In the typical CVD apparatus, molecular hydrogen 20, $H_2$, passes through an argon purge inlet 22 and a getter 24 to help remove impurities prior to entering the reactor. The mass flow rate of the molecular hydrogen 20 is controlled by a mass flow controller 26. The molecular hydrogen 20 together with the vapor source (hydrocarbon), together now termed the reactant gas R, exits the crucible 28. The vapor content of the carrier gas 20 is controlled by a vapor source controller 30. The mass flow rate of the reagent gases R is controlled by a mass flow controller 32 which allows the introduction of auxiliary gas 34 if a higher mass flow rate is necessary. The reagent gases R then are introduced to the CVD reactor 36 in which the CVI process occurs.

In the preferred embodiment of the present invention, the vapor source is a carbon source, such as methane gas. The preferred reagent gas R, comprising hydrogen and methane, is introduced to the CVI reactor, where atomic hydrogen radicals, H·, and carbon source radicals, for example, $CH_3·$, are formed, creating a plasma, as more fully disclosed below, which will infiltrate the preform 12.

The CVD reactor 36, shown schematically in Section b of FIG. 2, comprises a reactor tube contained within a furnace 38. A suitable reactor apparatus is disclosed in this inventor's U.S. Pat. No. 4,580,524, incorporated herein by this reference, with the modifications shown in FIG. 3 to create the CVI reactor. The preform 12 is supported within the reactor 36 by a support apparatus 42, described in more detail below. The reagent gases R may be introduced to the preform 12 via a water cooled injector 40. An optical pyrometer 44 and a pressure sensor 46 maintain constant or desired reaction parameters within the reactor 36. After the reagent gases R have infiltrated the preform 12, the exhaust gases E exit the reactor 36 and enter the effluent gas handling equipment shown in Section c of FIG. 2. The exhaust gases E are scrubbed in a scrubber column 48 before being exhausted from the system. In the most efficient operation of the process, the exhaust E gases contain very little or no carbon vapor.

A preferred embodiment of the preform support apparatus 42 is shown in schematic cross-section in FIG. 3. The preform support apparatus 42 was developed especially for the present process. As discussed above, there are obvious practical problems in subjecting a powder preform, or any other non-unitary preform, to forced flow conditions. For example, the forced flow of a reagent gas into a powder preform may blow the powder all over the reactor. Thus, a preform support apparatus 42 capable of retaining a powder preform during a forced flow process had to be developed.

The porous graphite support 50, typically made from carbon (grade 25 or 45 available form Union Carbide) is cemented 52 onto the inner perimeter of a dense graphite support 54. A powder preform 12 can be adequately supported in the preform support apparatus 42 while still allowing the forced flow of the reagent gases R through the preform 12 and out of the preform support apparatus 42 through the porous graphite support 50. The preform 12 porous graphite support 50 and dense graphite support 54 in turn are placed on top of and supported by a generally cup-shaped metal support 56 and separated therefrom by a graphoil O-ring 58. A plenum 60 is created between the porous graphite support 50 and the interior of the metal support 56. The preform 12, comprising a diamond powder in the form of the porous substrate is supported on a porous graphite support 50. The configuration of the porous graphite support 50 can be altered as desired to accommodate different size and configuration preforms 12, so as to result in articles other than discs. For example, the porous graphite support 50 can be configured such that when the preform 12 is subjected to CVI, a dome-shaped article results. Likewise, blocks, rods, and other shapes, whether regular or irregular can be produced using the present process.

The preform 12 preferably is densely packed prior to CVI so as to further reduce the diamond article formation time. Well-established particle packing technology can be used to prepare diamond particulate preforms of a very high density. Examples of particle packing technology are described in Lackey, W. J., et al., Sphere-Pac—A Practical Remote Fuel Fabrication Concept, 23 Transactions Of The American Nuclear Society 276 (1979) and Lackey, W. J., et al., Assessment of Gel-Sphere-Pac Fuel For Fast Breeder Reactors, ORNL-5468 (October 1978), both of which are incorporated herein by this reference. The laboratory packing of two or three sizes of diamond particles can yield a preform in the form of a packed bed as dense as 85 to 95% of theoretical density. Typically, the sizes of the particles are in the ratio of an order of magnitude; e.g. 100:10:1 µm. Alternatively, slip casting or vacuum slurry molding of particulates having carefully controlled particle size distributions also can yield very high density preform. Using such high density preforms also reduces the quantity of diamond which must be deposited. The use of three or more different sized particles in creating the preform 12 allows high density packing. By using three different sized particles in the preform 12, the middle sized particles can be used to fill a portion of the interstices created between neighboring large size particles and the smallest sized particles can be used to fill a portion of the interstices between the medium sized particles and the large size particles. Additionally, the use of various sized particles, or the use of various sized fibers or a mixture of particles and fibers, may change certain physical attributes of the resulting composite, such as increasing density, thermal conductivity and fracture strength.

In addition to a means for heating the reactor 36 to the operating temperature, and a means for creating the thermal gradient within the preform 12, the reactor 36 comprises a means for activating the reagent gases R to form a plasma. Suitable activation means include, but are not limited to, microwave sources, RF power, tungsten filaments, acetylene torches, DC arcs, and any other energy source which can raise the reagent gases R to above the plasma activation energy level. The molecular hydrogen and methane containing reagent gas R is subjected to the plasma activation source within the reactor 36 and a plasma comprised of several neutral, ion and radical species, including H· and $CH_3$·, is formed which does not have a very long existence. In the CVD art, the related phenomena is referred to as plasma enhanced chemical vapor deposition.

The plasma forms a ball over the preform 12. In a non-forced flow process, the plasma will infiltrate the preform 12 slowly as it comes in contact with the preform 12. In a forced flow process, the plasma is forced to infiltrate the preform 12, thus infiltrating the entire preform 12, and not merely its surface. The change in pressure as the plasma species enters the preforms 12 theoretically upsets the plasma and is detrimental to the deposition of diamond on the particles 64. Therefore, it is surprising that the plasma species will exist within the preform 12. Further, the denser packing of the preform 12 achieved through the particle packing method makes the diffusion process more difficult in porous substrates, thus increasing the pressure drop across the preform 12. Although such denser packing is a strong argument to use forced flow in this process, the combination creates a higher pressure drop, thus theoretically creating unfavorable conditions for the deposition of the diamond onto the preform 12 particles.

Figure 4:
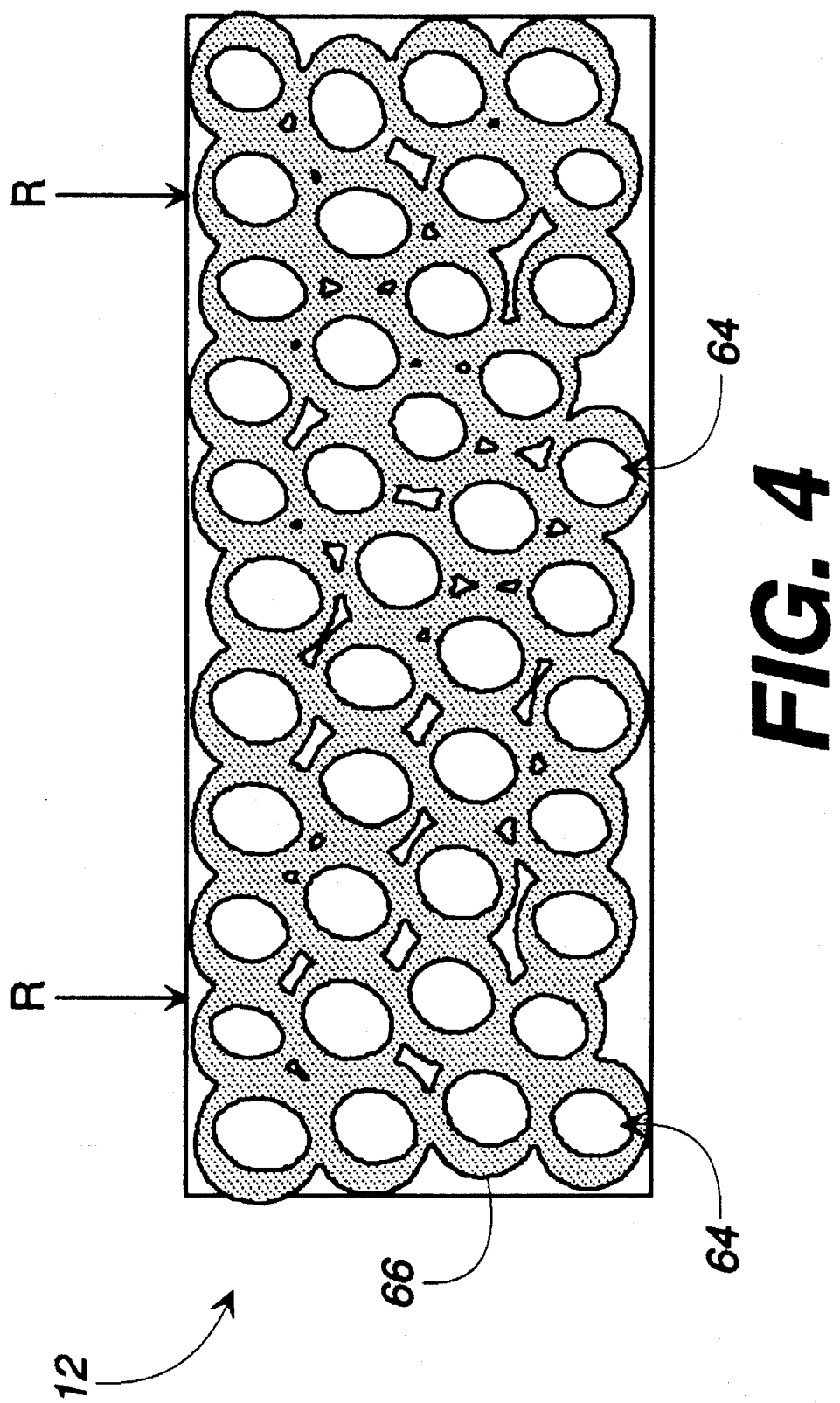
FIG. 4 is a representation of the preform particles as they are becoming coated with a diamond coating and the interlocking of the diamond coating according to the process of the present invention.

The reagent gases R are forced to enter and infiltrate the structure of the preform 12. As shown in greater detail in FIG. 4, the preform 12 comprises diamond constituents 64 which may be powder particles, but can be of any size and configuration, such as fibers, flakes or crystallites, or mixtures of these. Materials other than diamond may also comprise the preform. As the reagent gases R infiltrate the preform 12, diamond is deposited as a coating 66 on the diamond particles 64. As the coating 66 thickens, the coatings 66 on the various particles 64 will interact and intermesh with each other to form a matrix. As the coatings 66 grow, the preform 12 densifies and becomes a diamond article. Forced flow CVI achieves up to 50 times or more the deposition rate of non-forced flow CVI.

The mechanism for diamond growth using this plasma is not clearly understood. In one possible mechanism, a methyl radical, $CH_3$·, adheres to the surface of one of the particles of the preform 12. A hydrogen radical H·, or atomic hydrogen, collides with the methyl radical, reacting with the methyl radical to form molecular hydrogen gas $H_2$ which is released to the atmosphere, and a $CH_2$·· radical which remains attached to the preform particle. A second methyl radical collides with and attaches to the $CH_2$·· radical and the mechanism continues with a hydrogen radical colliding with the second methyl radical. Eventually, a buildup of C—C bonds results in a diamond film.

The depleted reagent gases R exit the preform 12 and travel through the porous graphite support 50 and into the plenum 60. At this point, the reagent gases R are considered exhaust gases E. The exhaust gases E exit the plenum 60 through the exit port 68 to the effluent gas handling section. A vacuum may be pulled through the exhaust port 68 and the plenum 60 in order to facilitate the exhausting of the exhaust gases E.

For isothermal-flow forced CVI, the furnace 32 typically is sufficient to isothermally heat the preform 12 for the CVI process. The schematic shown in FIG. 2 is a schematic for isothermal heating. As a first alternative, a heating stage 62 can be located contiguous to the metal support 56 such that heat from the heating stage 62 is transferred to one surface of the preform 12 via the metal heat support 56, the dense graphite support 54, and the porous graphite support 50. Thus, one surface of the preform 12 will be hotter than the opposite surface, creating a thermal gradient through the preform 12. As a second alternative, the other surface of the preform 12, opposite the surface heated by the heating stage 62, may be actively cooled, thus creating a greater thermal gradient through the preform 12. The apparatus disclosed in this inventor's U.S. Pat. No. 4,580,524 achieves this gradient. The sides 106 of the preform 12 also may be actively cooled to create the lens-shaped thermal gradient discussed above.

The thick diamond article which is formed via the present process can be used as is or further acted upon as desired. By thick is meant an article having a thickness of about 1 to 3 mm or more. Potential applications for the diamond articles include, but are not limited to, thermal management substrates for electronic devices such as multi-chip modules, electromagnetic windows and domes, cutting tools and filters. Additionally, the diamond articles can be used as chemical, wear and erosion resistant articles such as for extrusion purposes or other dies and nozzles. As one example, the diamond matrix composites produced by the present process have potential for use as high thermal conductivity substrate materials for microelectronic packaging. They also can be used in the aerospace industry as nosecones and brakes and in the fiber optic industry as high thermal conductivity substrate materials. Other applications include other irregularly shaped parts which need to be composed of a dense, hard material.

Figure 5A:
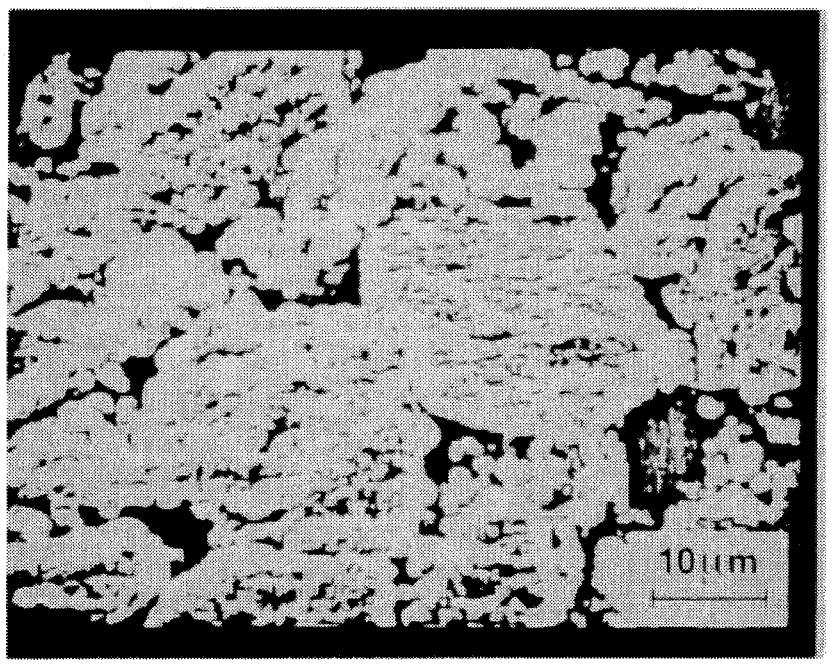
FIG. 5 are photomicrographs representative of the product resulting from the present process, showing the analogous bonding of silicon carbide particles with CVI diamond during the early stages of deposition.
Figure 5B:
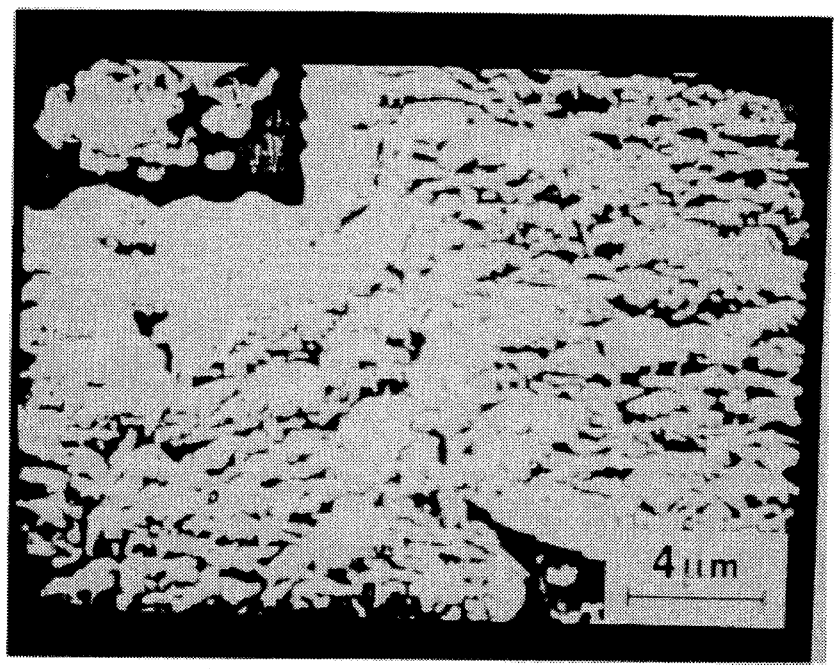

The photomicrographs shown in FIG. 5a and FIG. 5b show the early stages of consolidation of silicon carbide particles with CVI diamond vapor as representations of the product formed by the present process. These two photomicrographs show the bonding between the diamond deposited from the CVI and the silicon carbide particles. The silicon carbide platelets shown in FIG. 5 are coated with and consolidated by diamond deposited by microwave plasma assisted CVD. The particles are bonded together by the deposited diamond.

A specific application of the preform support apparatus 42 shown in FIG. 3 utilizes a disc-shaped preform 12 of approximately 1 to 5 cm in diameter and 1 to 2 mm thick. An isothermal CVI is performed by placing the preform 12 onto the heated sample stage of a microwave plasma assisted diamond deposition system, such as the Astex Model S-1000. Infiltration rate and uniformity can be adjusted by adjusting the temperature, pressure and reagent concentration of the system. It is well-known that for CVD/CVI processing low temperature, low pressure, and low reagent concentration enhance infiltration, whereas high temperature, high pressure and high reagent concentration enhance coating the external surface. The temperature, pressure and reagent concentration can be varied to achieve the desired level of infiltration.

Reactant gases R are introduced to the reactor 36 at about room temperature, typically 20° C.–30° C., and at approximately atmospheric pressure, typically 12 psig–18 psig. A typical reagent gas composition is between about 0.1% and about 2.0% $CH_4$ and between about 99.9% and about 98.0% $H_2$, with about 0.5% $CH_4$ and about 99.5% $H_2$ being the preferred composition. Additionally, the addition of halogens or halogenate organics, typically less than 1%, can be added to the reagent gas R to enhance the vapor effects by causing additional plasma-like affects. The addition of $O_2$ or ROH, typically less than 1% and preferably less than 0.2%, to the reagent gas R has been found to speed up the deposition rate within the preform by a factor of 2–3.

The reactor 36 is heated to between 500° C. and 1200° C. Although any temperature gradient across the preform 12 will enhance the deposition within the preform 12 as discussed above, it is preferable to have a temperature gradient of approximately 50° C. to several hundred degrees centigrade between the cooler surface 102 and the hotter surface 104. The typical deposition rate of diamond in a preform 12 using a reactor 36 configured to carry out the present process, using microwaves as the plasma activation energy source, allows the consolidation of a 1 mm thick diamond particle preform in approximately 20 hours, a factor of 50 quicker than the prior art.

Although a typical microwave plasma assisted diamond deposition apparatus, such as the Astex Model S-1000, can be utilized as the base equipment for the present process, it must be modified in order to force the reagent gas R stream to flow through the diamond particulate preform 12. The reactor equipment for infiltrating a preform using the thermal gradient-forced flow CVI or pulse CVI processes should be modified to improve the infiltration. The preform support apparatus 42 as shown in FIG. 3, is suitable.

By analogy with the SiC deposition process discussed above, flowing the reagent gases R through the preform 12 significantly increases, by a factor of up to 50 or more, the deposition rate of diamond onto the diamond particulate, thereby reducing the processing time. The porous graphite support 50 offers a resistance to the reagent gases R flow which will cause the reagent gases R stream to spread out and flow uniformly throughout the preform 12. Optimization of temperature, temperature gradient, reagent concentration and flow rate can reduce the infiltration time and improve the infiltration uniformity. These variables also can influence the structure of the deposited coating matrix and therefore the properties of the final diamond article.

It is preferable for the CVI process to be controlled by surface reaction kinetics rather than diffusion because the reagent gases R enter further into the preform 12 before deposition; control by diffusion may not allow the required extent of infiltration. For CVI processes where the deposition is controlled by diffusion CVD results in the coating of the exterior surfaces. Controlling the CVI process by surface reaction kinetics allows the coating of the various particles 64 within the preform 12 after infiltration. Lower temperatures favor kinetically controlled processes and, therefore, within limits, low temperatures are preferred in the present process. Lower temperatures allow infiltration, as opposed to overcoating the surface; however, lower temperatures also reduce the overall deposition rate. Lower pressures are desired in present process as diffusion is faster and chemical reaction rates are slower with a reduction in reagent concentration or pressure. Faster diffusion and slower reaction rates enhance infiltration. It also is desirable to have a low molecular weight gas as the carrier gas 20 as reagent diffusion is more rapid with such a low molecular weight gas.

Endothermic reaction types with high activation energies are preferred in the present process. Typically, for a thermal gradient process, a high activation energy enhances deposition at hot regions of the preforms 12 relative to the cooler regions. Therefore, for a thermal gradient process, higher activation energy allows the deposition to occur initially at the hot surface 104 of the preform 12 and move toward the cooler surface 102 of the preform 12 as the preform 12 becomes densified.

Thus, the present rapid process for the preparation of diamond articles combines forced flow thermal gradient or pulse CVI of diamond into a high density preform comprising packed diamond particles, a combination which has not been disclosed in the prior art.

The above detailed description of a preferred embodiment is the best mode for the process contemplated by the inventors at this time. It will be apparent to those skilled in the art that various modifications and alterations may be made to this process without departing from the spirit and scope of the invention, which modifications and alterations are intended to be within the scope of the invention, as defined in the following claims.

What is claimed is:

1. A process for the preparation of a formed diamond article, comprising the steps of:

(a) preparing a porous preform of constituents selected from the group consisting of diamond particles, ceramic fibers, ceramic powders, and mixtures thereof, said preform having at least two surfaces and a thickness, said preform having an initial density of between about than 30% and about 95% of theoretical density and being permeable to a gas including a carrier gas and a carbon vapor compound;

(b) preparing a reagent gas including a carrier gas and a carbon vapor compound;

(c) subjecting said preform to chemical vapor infiltration at a pressure of between about $10^{-2}$ torr and about $10^3$ torr utilizing said reagent gas as the infiltrating medium, wherein said reagent gas is passed into and through said preform by creating a pressure differential through said preform, said reagent gas entering said preform through a first surface of said at least two surfaces, infiltrating said thickness of said preform, and exiting said preform through a second surface of said at least two surfaces, said second surface being heated to a temperature of between about 500° C. and about 1200° C.;

(d) depositing said carbon vapor compound onto said constituents within said preform resulting in the densification of said preform at a rate of approximately 0.05 mm/hr or greater; and (e) recovering a composite diamond article consisting of said constituents bonded together by said deposited carbon vapor compound and having a thickness of at least 1 mm.

2. A process for the preparation of diamond articles as characterized in claim 1, wherein said reagent gas is supplied to said chemical vapor infiltration step initially at a temperature of between about 20° C. and about 30° C.

3. A process for the preparation of diamond articles as characterized in claim 2, wherein said chemical vapor infiltration step occurs at a pressure of between about 1 torr and about 100 torr.

4. A process for the preparation of diamond articles as characterized in claim 3, wherein said chemical vapor infiltration step is accomplished by a forced flow of said reagent gas into and through said preform, said forced flow being created by a pressure differential through said preform.

5. A process for the preparation of diamond articles as characterized in claim 4, wherein said preform is maintained at isothermal conditions during said chemical vapor infiltration step.

6. A process for the preparation of diamond articles as characterized in claim 4, wherein a thermal gradient is maintained in said preform during said chemical vapor infiltration step.

7. A process for preparation of diamond articles as characterized in claim 3, wherein said chemical vapor infiltration step is accomplished by the pulsed flow of said reagent gas into and through said preform, said pulsed flow being created by a pressure differential through said preform.

8. A process for the preparation of diamond articles as characterized in claim 7, wherein said preform is maintained at isothermal conditions during said chemical vapor infiltration step.

9. A process for the preparation of diamond articles as characterized in claim 7, wherein a thermal gradient is maintained in said preform during said chemical vapor infiltration step.

10. A process for the preparation of diamond articles as characterized in claim 3, wherein said preform is created by particle packing, fiber packing or particle and fiber packing.

11. A process for the preparation of diamond articles as characterized in claim 10, wherein said reagent gas further includes a halide.

12. A process for the preparation of diamond articles as characterized in claim 11, wherein said reagent gas further includes a component selected from the group consisting of $O_2$ and ROH.

13. A process for the preparation of diamond articles as characterized in claim 10, wherein said diamond article has a thickness of about 0.5 mm or more.

14. A process for the preparation of diamond articles as characterized in claim 6, wherein said reagent gas is forced to flow in the same direction of said thermal gradient.

15. A process for the preparation of diamond articles as characterized in claim 9, wherein said reagent gas is forced to flow in the same direction of said thermal gradient.

16. A process for the preparation of a formed diamond article, comprising the steps of:
   (a) preparing a porous preform consisting essentially of diamond particles wherein said preform has at least two surfaces and a thickness, is prepared by particle packing and has an initial density of between about 30% and about 95% of theoretical density and is permeable to a gas including a carrier gas and a carbon vapor compound;
   (b) preparing a reagent gas comprising hydrogen and a carbon source;
   (c) introducing sufficient energy to said reagent gas so as to form a plasma;
   (d) subjecting said preform to forced flow chemical vapor infiltration at a pressure of between about $10^{-2}$ torr and about $10^3$ torr utilizing said plasma to infiltrate said preform wherein said plasma is passed into and through said preform, said plasma entering said preform through a first surface of said at least two surfaces, infiltrating said thickness of said preform, and exiting said preform through a second surface of said at least two surfaces, said first surface being at a first temperature and said second surface being at a second temperature at least approximately 50° C. greater than said first temperature, and said forced flow is created by a pressure differential through said preform;
   (e) depositing said carbon source from said plasma onto said particles within said preform resulting in the densification of said preform at a rate of approximately 0.05 mm/hr or greater; and
   (f) recovering a composite diamond article consisting of said diamond particles bonded together by said deposited carbon source and having a thickness of at least 1 mm.

17. A process for the preparation of diamond articles as characterized in claim 16, further comprising the step of:
   (a1) creating a temperature gradient across said preform.

18. A process for the preparation of a formed diamond article, comprising the steps of:
   (a) preparing a porous preform, said preform comprising ceramic fibers and having at least two surfaces and a thickness and an initial density of between about 80% and about 95% of theoretical density and being permeable to a gas including a carrier gas and a carbon vapor compound;
   (b) preparing a reagent gas comprising hydrogen and a carbon source;
   (c) introducing sufficient energy to said reagent gas so as to form a plasma;
   (d) subjecting said preform to forced flow chemical vapor infiltration at a pressure of between about $10^{-2}$ torr and about $10^3$ torr utilizing said plasma to infiltrate said preform wherein said plasma is passed into and through said preform, said plasma entering said preform through a first surface of said at least two surfaces, infiltrating said thickness of said preform, and exiting said preform through a second surface of said at least two surfaces, said first surface being at a first temperature and said second surface being at a second temperature equal to or greater than said first temperature, and said forced flow is created by a pressure differential through said preform;
   (e) depositing said carbon source from said plasma onto said particles within said preform resulting in the densification of said preform at a rate of approximately 0.05 mm/hr or greater; and
   (f) recovering a composite diamond article consisting of said ceramic fibers bonded together by said deposited carbon source and having a thickness of at least 1 mm.

19. A process for the preparation of diamond articles as characterized in claim 18, further comprising the step of:
   (a1) creating a temperature gradient across said preform.

20. A process for the preparation of diamond articles as characterized in claim 18, wherein said preform consists essentially of ceramic fibers and diamond particles.

21. The process as claimed in claim 18, wherein said preform has an initial density of greater than 80% of theoretical density.

22. The process as claimed in claim 20, wherein said preform has an initial density of greater than 80% of theoretical density.

* * * * *